United States Patent
Chung

(10) Patent No.: US 7,217,159 B2
(45) Date of Patent: May 15, 2007

(54) ELECTRICAL CONNECTOR WITH RETAINING DEVICE

(75) Inventor: Yung-Chien Chung, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/406,544

(22) Filed: Apr. 14, 2006

(65) Prior Publication Data

US 2006/0234530 A1 Oct. 19, 2006

(30) Foreign Application Priority Data

Apr. 19, 2005 (CN) .................... 2005 1 0039017

(51) Int. Cl.
H01R 13/648 (2006.01)
(52) U.S. Cl. .................. 439/607; 439/79; 439/569
(58) Field of Classification Search ........... 439/607, 439/79, 83, 876, 566, 569
See application file for complete search history.

(56) References Cited

U.S. PATENT DOCUMENTS 6,120,323 A   9/2000   Zhung et al.

| 2002/0086581 A1* | 7/2002 | Chen et al. ............. 439/607 |
| 2002/0173202 A1* | 11/2002 | Okamoto ................. 439/607 |
| 2004/0157491 A1* | 8/2004 | Lin ....................... 439/607 |
| 2004/0242069 A1* | 12/2004 | Yang ...................... 439/607 |
| 2005/0277332 A1* | 12/2005 | Chen ...................... 439/607 |

FOREIGN PATENT DOCUMENTS

| TW | 392971 | 6/2000 |
| TW | 521888 | 2/2003 |
| TW | M249293 | 1/2004 |

* cited by examiner

*Primary Examiner*—Hien Vu
(74) *Attorney, Agent, or Firm*—Wei Te Chung

(57) ABSTRACT

An electrical connector (100) adapted for being assembled in a notch (4) of a Printed Circuit Board (PCB) (200) comprises a dielectric housing (1) defining passageways (12) thereon, a plurality of contacts (2) received in corresponding passageways, and a retaining device (31) retaining the electrical connector to the PCB. Each contact comprises a soldering section (22) extending out the dielectric housing and retained on the PCB. The retaining device has a same thickness W to that of each soldering section of the contact.

10 Claims, 4 Drawing Sheets

ELECTRICAL CONNECTOR WITH RETAINING DEVICE

BACKGROUND OF THE INVENTION

1. Field of the Invention

The present invention relates to an electrical connector, and more particularly to an electrical connector adapted for mounting in a notch of a Printed Circuit Board.

2. Description of the Related Art

Conventional electrical connectors, such as Universal Serial Bus (USB) connectors, generally include a dielectric housing, a plurality of contacts retained in the housing and a periphery shielding shell surrounding the housing for preventing from Electro-Magnetic Interfere (EMI). The shell generally has a retaining device, by which the connector is fasten on one surface of the PCB, directly extending therefrom.

TW Patent No. 392971 discloses a first type electrical connector, which is substantially similar to aforementioned conventional electrical connectors. The retaining device laterally extends from the approximate mid-height portion of the shell. The electrical connector is assembled in a notch of a PCB with the retaining device locked on the PCB, which will reduce the height of connector on the PCB. But, if the connector is assembled on another, bottom surface of the PCB, it can not ensure a normal mating.

TW Patent No. 521888 discloses a second type electrical connector, which should be assembled on a bottom surface of a PCB in light of layout of the PCB. Thus, for ensure a normal mating of a complementary connector inserted into the connector for facility of users, another metal shell is added encasing the connector to retain it on the PCB. However, this type connector is complex and increases cost.

Hence, an improved electrical connector is desired to overcome the above problems.

BRIEF SUMMARY OF THE INVENTION

It is an object of the present invention to provide an electrical connector, which is fitted on a Printed Circuit Board (PCB) with lower height and mating-facility for users.

In order to obtain the objective above, an electrical connector adapted for being assembled in a notch of a PCB according to a preferred embodiment of the present invention comprises a dielectric housing defining passageways thereon, a plurality of contacts received in corresponding passageways, and a retaining device retaining the electrical connector to the PCB. Each contact comprises a soldering section extending out the dielectric housing and soldered on the PCB. The retaining device has a same thickness to that of the soldering section of each contact.

Other objects, advantages and novel features of the invention will become more apparent from the following detailed description of the present embodiment when taken in conjunction with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE INVENTION

Figure 1:
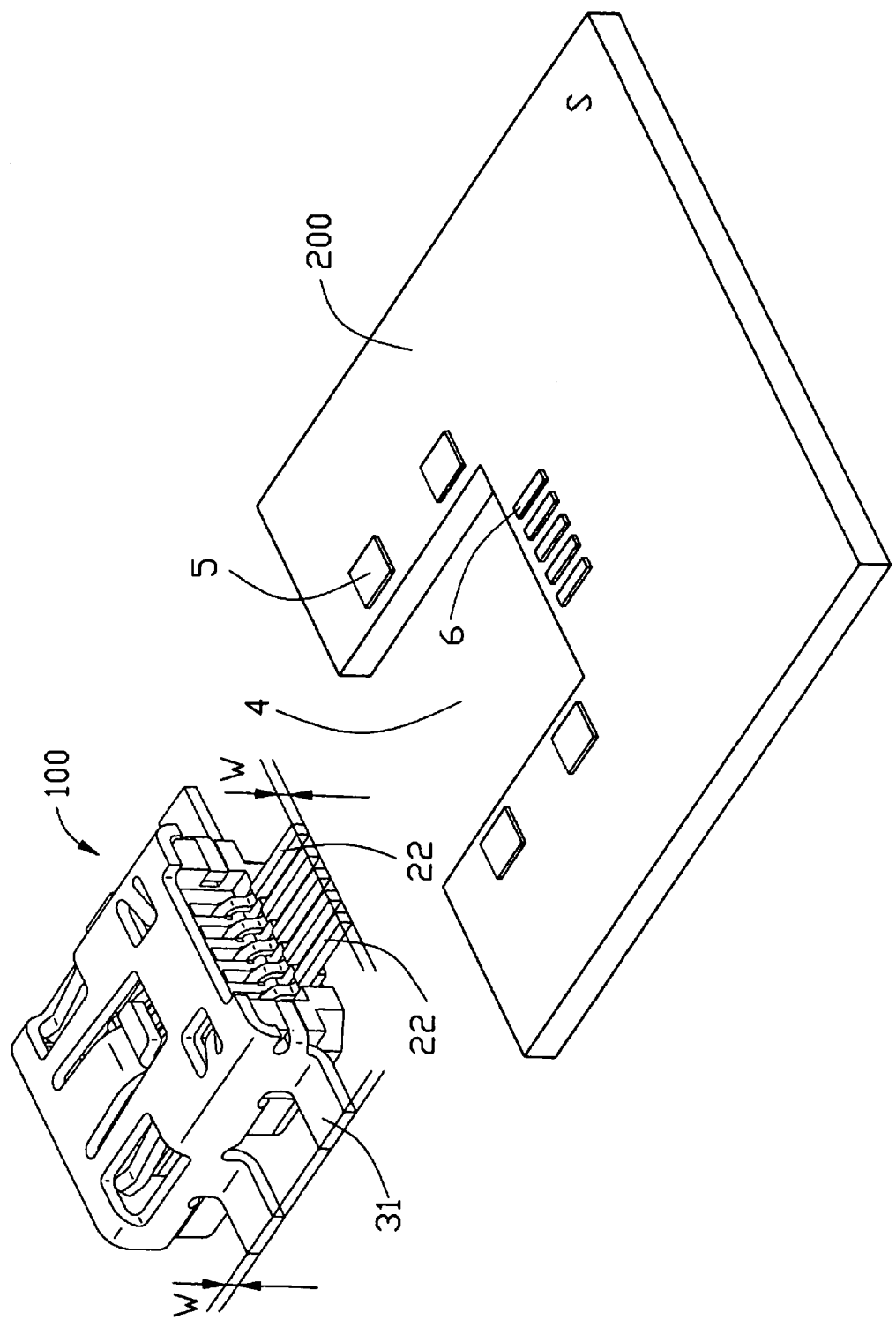
FIG. 1 is a perspective view showing an electrical connector and a PCB according to an embodiment of the present invention, where the connector is not assembled to the PCB.

In the following detailed description, for purposes of explanation, numerous specific details are set forth in order to provide a thorough understanding of the present invention. It will be apparent, however, that the present invention may be practiced without these specific details. In other instances, well-known structures and devices are schematically shown in order to simplify the drawing.

Referring to FIGS. 1–6, an electrical connector 100 according to one embodiment of the present invention is adapted to fit in a notch 4 of a Printed Circuit Board (PCB).

Figure 4:
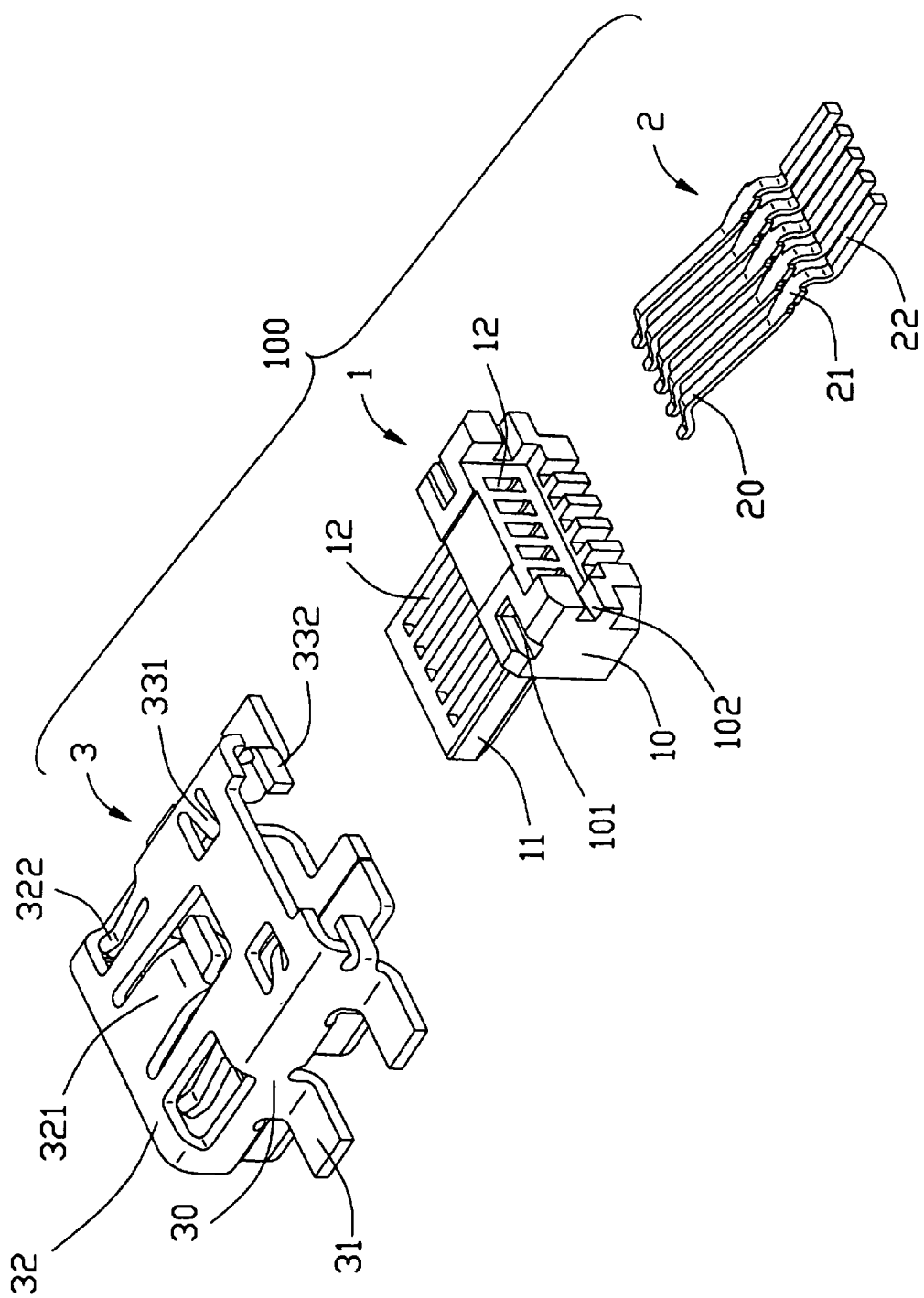
FIG. 4 is an exploded view of the electrical connector.

Referring to FIGS. 1 and 4, the electrical connector 100 includes a dielectric housing 1, a plurality of contacts 2 received in the housing 1, and a shielding shell 3 surrounding the housing 10 for preventing from EMI.

The dielectric housing 1 includes a rectangular base portion 10 and a tongue portion 11 projecting forwards from the base portion 10. A plurality of parallel passageways 12 are defined to extend from the base portion 10 to the tongue portions 11 in a front-and-back direction. Each contact 2 includes a retaining section 21, a contacting section 20 and a soldering section 22, the contact and soldering sections respectively extending oppositely from two opposite ends of the retaining section 21. The contacts 2 are forwardly inserted into the passageways 12 of the housing 1 from a rear side of the housing 1, with the retaining sections 21 fitted in corresponding passageways of the base portion 10, the contacting sections 20 positioned in corresponding passageways and exposed in the upper surface of the tongue sections 11 and the soldering section 22 extending out the base portion 10.

Figure 3:
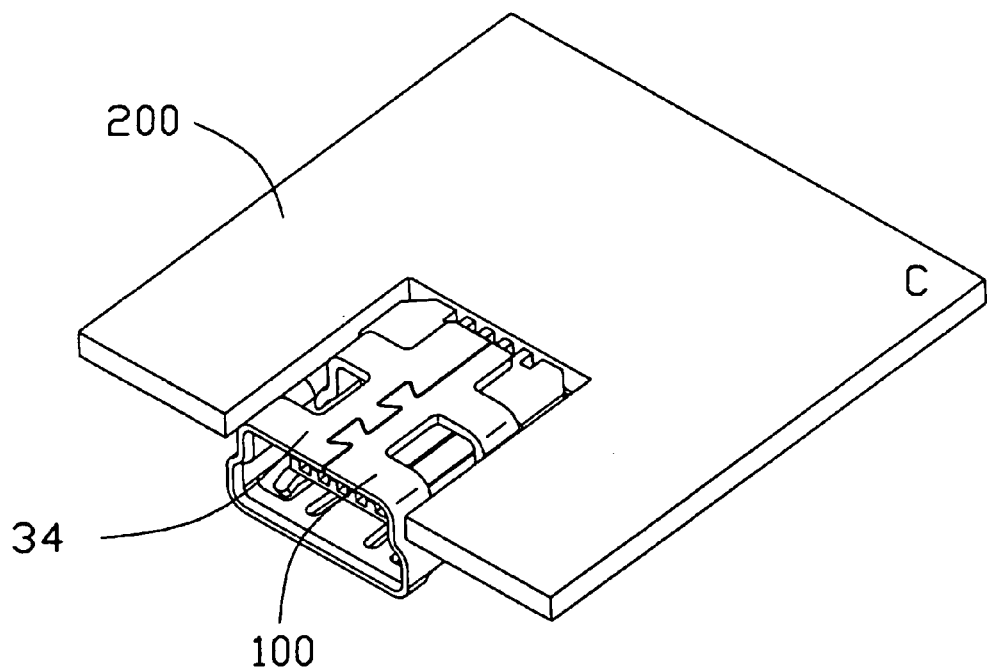
FIG. 3 is a bottom perspective view of the electrical connector retained on the upper surface of the PCB.

The shielding shell 3 is of a rectangular frame formed by joining a metal strip end to end with a swallowtail joint at the bottom wall 34 (shown in FIG. 3). The shell 3 has a pair of retaining portions 31 bent outwards from each sidewall 30 thereof and extending parallel to the bottom wall 34. The shell 3 defines a backwards-extending resilient arm 321 and a pair of forwards-extending resilient arms 322 on the upper wall 32 thereof. The resilient arms 321, 322 are formed for engaged with a mating electrical connector (not shown). The shell further has a pair of locking portions 331 behind the resilient arms on the upper wall 32 and a pair of locking portions 332 on the rear side of the sidewalls 30. As best shown in FIG. 1, the locking portions 331, 332 is retained in corresponding slots 101,102 respectively on the upper and back face of the base portion 10. Other parts of the connector 100 are similar to conventional connectors and will not be depicted in detail herein.

Referring to FIG. 1, the PCB has metal pads 5 and 6 adjacent to the notch 4 on an upper surface thereof. The retaining pads 5 are defined for being soldered with the retaining potions 31 of the shell. The conductive pads 6, connecting with signal transmission traces (not shown) on the PCB, are defined for being soldered with the soldering sections 22 of the contacts 2. The pads may be a gold-filled layer and are so thin that the thickness thereof can be omitted. A thickness of the retaining portion 31 of the shell, designated as W, equals to that of the soldering sections 22 of the contacts 2.

The PCB is double-surface. When the PCB assembled to electronic apparatus (not shown), one surface of the PCB orients upward or outward, another surface orients downward or inward. For convenience, as shown in FIGS. 1 and 3, the face marked with letter S on its right corner is defined as the upward-orienting surface, named as the upper face of the PCB. And the opposite surface marked with letter C is defined as the downward-orienting surface, named as the bottom face of the PCB.

Figure 2:
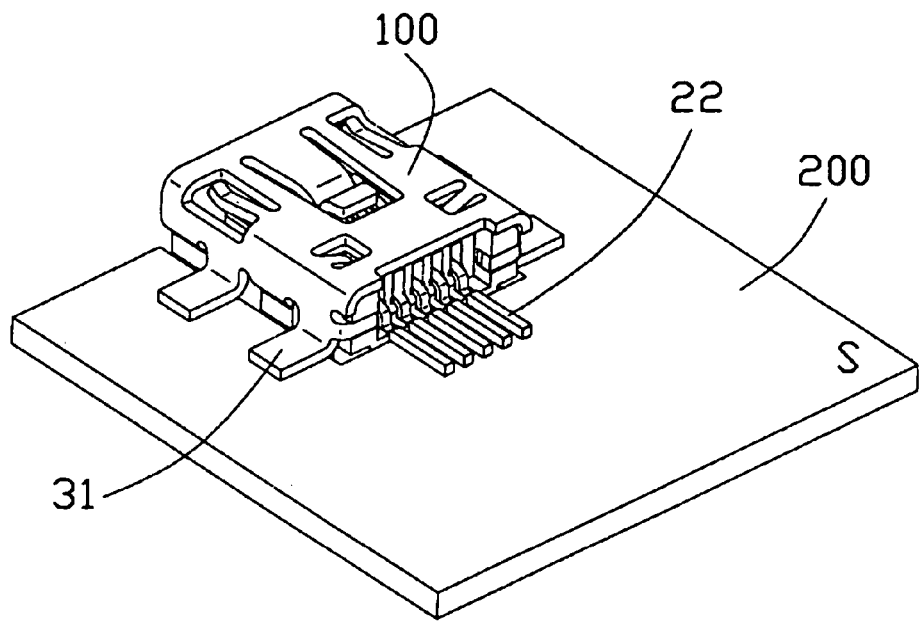
FIG. 2 is a top perspective view of the electrical connector retained on the upper surface of the PCB.

Referring to FIG. 2 in conjunction with FIG. 1, the connector 100 is assembled into the notch 4 of the PCB in a normal position. The bottom face of each retaining portion 31 of the shell is soldered to the retaining pad 5 and the corresponding bottom face of each soldering section 22 of the contact is soldered to the conductive pad 6. FIG. 3 shows the bottom aspect of the connector 100 of FIG. 2. The assembling process/method of connector 100 to the PCB is well-known and thus will not be verbosely described.

Figure 5:
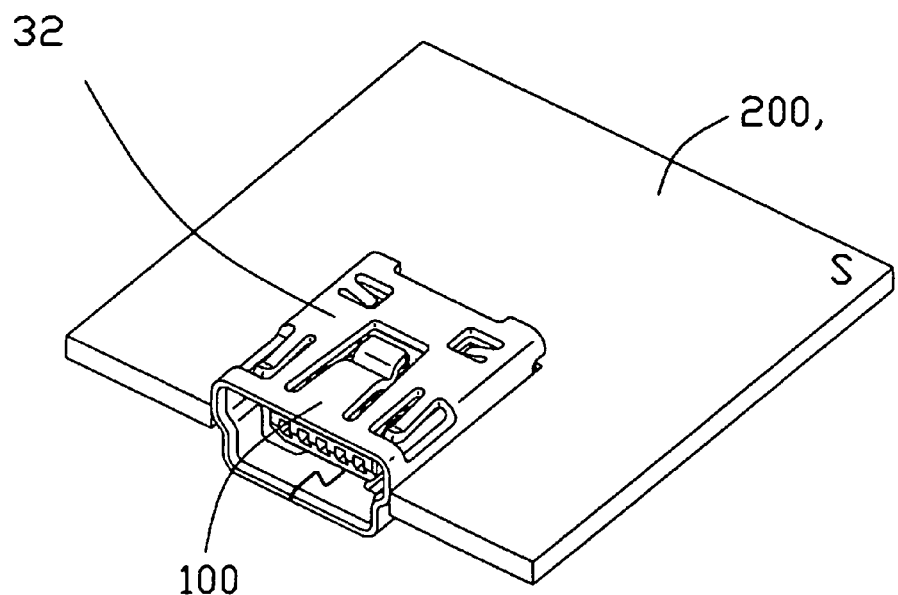
FIG. 5 is a top perspective view of the electrical connector retained in the bottom surface of the PCB.
Figure 6:
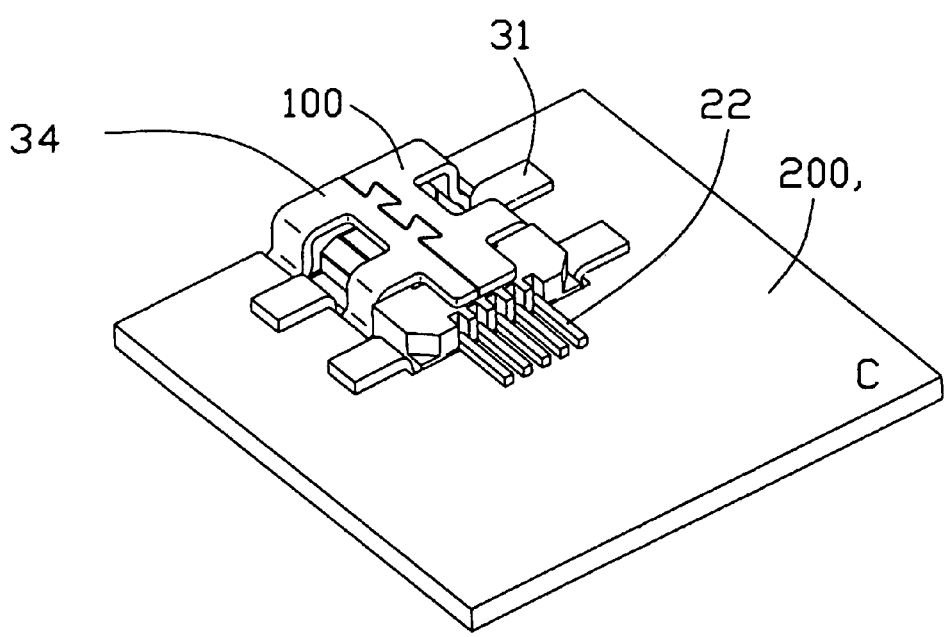
FIG. 6 is a bottom perspective view of the electrical connector retained in the bottom surface of the PCB.

FIGS. 5–6 provide a PCB 200' similar to said PCB 100, but the metal pads and trace of the PCB 200' only on the bottom face thereof. Therefore the connector 100 must to be retained on the bottom surface. Referring to FIGS. 5–6 in conjunction with FIG. 1, the connector 100 is assembled to the notch 4 of the PCB also in normal position, wherein the upper surface of each retaining portion 31 of the shell and each retaining section 22 are soldered with metal pads on the bottom surface. The upper surface of the retaining portion 31 and the retaining section 22 is on a same plane which is ensured by the same thickness of the retaining portion 31 and the soldering section 22. In this embodiment, each retaining portion 31 is bent from the middle height portion of the sidewall 30 of the shielding shell 3 to achieve optical heights of the connector on the PCB. The embodiment provides a normal mating method of the connector 100 and the mating connector which is widely known by user, in despite of the connector 100 is retained on the bottom face of the PCB 200'. Alternatively, the PCBs 200' and 200 might be a same PCB, and the metal pads are on both surfaces, but the connector 100 must be retained on the bottom surface for other reason.

As aforementioned, the retaining portion 31 of the shell 3 serving as a retaining device also can be connected to a grounding trace (not shown) of the PCB 200 for achieving an additional grounding function. Alternatively, the retaining device can be secured to the PCB by a bolt, or the retaining device is formed with a pair of flanges integratively extending from two opposite ends of the dielectric housing and a bolt locking the flange to the PCB, which is widely used in battery connector. The retaining device of said connectors has a same thickness to that of the soldering section 22 of the contact 2.

In other embodiment, when a connector is fitted into the notch 4 of PCB at a predetermined angle, two opposite surfaces of retaining portions and soldering sections of contacts are defined at a same angle equaling to said predetermined angle. Thus, the upper surface and bottom surface of said two are respectively on a same plane, and the connector can be retained on either surface of the PCB.

It is to be understood, however, that even though numerous, characteristics and advantages of the present invention have been set fourth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. An electrical connector adapted for being assembled in a notch of a Printed Circuit Board (PCB) comprising:
    a dielectric housing defining passageways thereon;
    a plurality of contacts received in corresponding passageways, each contact comprising a soldering section extending out the dielectric housing and retained on the PCB;
    a retaining device for retaining the electrical connector to the PCB, the retaining device having a same thickness as that of the soldering section of the contact;
    further comprising a shielding shell surrounding the housing, wherein said retaining device is formed on said shell; wherein
    the dielectric housing comprises a base portion, a tongue portion projecting forwards from the base portion and a plurality of parallel passageways extending from the base portion to the tongue portion to receive the contacts; wherein
    the contacts and the retaining device are arranged to be capable of being commonly and coplanarly surface-mount soldered on either an upper surface or an under surface of the printed circuit board under a condition that the connector is displaced in a same oriented manner.

2. The electrical connector according to claim 1, wherein the retaining device is bent from approximately the middle height portion of each sidewall of the shell.

3. The electrical connector according to claim 1, wherein the base portion defines slots both on the upper and back walls thereof, and the shell comprises locking portions engaging with said slots.

4. The electrical connector according to claim 3, wherein each contact comprises a retaining section secured in the base portion, a contact section extending from one end of the retaining section to position on the tongue portion, said soldering section extends from the other end of the retaining section.

5. An electrical connector adapted for being assembled in a notch of a Printed Circuit Board (PCB), comprising:
    a dielectric housing defining passageways thereon;
    a plurality of contacts received in corresponding passageways, each contact comprising a soldering section extending out the dielectric housing and electrically and mechanically connecting to the PCB;
    a retaining device mounted to the PCB; wherein
    the retaining device and the soldering section respectively have an upper face and a bottom face opposite to the upper face, and the upper faces of the retaining device and the soldering section are on a same plane and the bottom faces of the retaining device and the soldering section are also on a same plane; further
    comprising a shielding shell surrounding the housing, wherein the retaining device is bent from the mid-height of sidewalls of the shell; wherein
    the dielectric housing comprises a base portion, a tongue portion projecting forwards from the base portion and a plurality of parallel passageways extending from the base portion to the tongue portion to receive the contacts; wherein the contacts and the retaining device are arranged to be capable of being commonly and coplanarly surface-mount soldered on either an upper surface or an under surface of the printed circuit board under a condition that the connector is displaced in a same oriented manner.

6. The electrical connector according to claim 5, wherein the dielectric housing defines a pair of flanges on two opposite ends thereof to form said retaining device.

7. A connector assembly comprising:
a printed circuit board defining a cutout along an edge thereof, a plurality of solder pads formed on at least one of upper and under surfaces of said printed circuit board proximate said cutout, and
an electrical connector including an insulative housing enclosing a plurality of contacts and enclosed by a metal shell, said shell defining at least one horizontal retaining portion; wherein
the retaining portion and tails of the contacts commonly define not only an upper plane but also a bottom plane thereon for soldering to the corresponding solder pads; wherein
the insulative housing comprises a base portion, a tongue portion projecting forwards from the base portion and a plurality of parallel passageways extending from the base portion to the tongue portion to receive the contacts; wherein
said shell including an upper wider portion and a lower narrower portion; wherein
said narrower portion is received in the cutout when the connector is fastened to the printed circuit board via said bottom plane; wherein
the contacts and the retaining device are arranged to be capable of being commonly and coplanarly surface-mount soldered on either the upper surface or the under surface of the printed circuit board under a condition that the connector is displaced in a same oriented manner.

8. The assembly as claimed in claim 7, wherein said cutout is dimensioned to be large enough to receive said upper wider portion when the connector is fastened to the printed circuit board via said upper plane.

9. The assembly as claimed in claim 7, wherein the retaining portion extends and is split from a transition region between the upper wider portion and the lower narrower portion.

10. The assembly as claimed in claim 7, wherein the retaining portion is an unitary piece where both the upper plane and the bottom plane are applied and which has a same thickness with the tail.

* * * * *